United States Patent [19]

Dubots

[11] Patent Number: 4,531,982
[45] Date of Patent: Jul. 30, 1985

[54] SUPERCONDUCTOR MANUFACTURING PROCESS

[75] Inventor: Patrick Dubots, Neauphle le Chateau, France

[73] Assignee: Alsthom-Atlantique, S.A., Paris, France

[21] Appl. No.: 588,053

[22] Filed: Mar. 9, 1984

[30] Foreign Application Priority Data

Mar. 16, 1983 [FR] France ................. 83 04284

[51] Int. Cl.³ ............................................ H01L 39/00
[52] U.S. Cl. .................... 148/11.5 F; 29/599; 148/11.5 Q
[58] Field of Search ............... 29/599; 148/11.5 Q, 148/, 11.5 F

[56] References Cited

U.S. PATENT DOCUMENTS

| | | | |
|---|---|---|---|
| 3,489,604 | 1/1970 | Benz et al. ............................. | 29/599 |
| 3,817,746 | 6/1974 | Tsuei ................................. | 148/11.5 Q |
| 3,963,425 | 6/1976 | Sambrook ......................... | 174/128 S |
| 4,073,666 | 2/1978 | Marancik et al. ............... | 148/11.5 Q |
| 4,367,102 | 1/1983 | Wilhelm .......................... | 148/11.5 F |
| 4,411,712 | 10/1983 | Marancik ....................... | 148/11.5 F |

FOREIGN PATENT DOCUMENTS 1413795  11/1975  United Kingdom .

Primary Examiner—Wayland Stallard
Attorney, Agent, or Firm—Kenyon & Kenyon

[57] ABSTRACT

A superconductor manufacturing process provides electrical insulation and enhanced transverse electrical resistivity of multifilament superconductor strands based on Nb$_3$Sn. The process includes forming, during the early manufacturing steps in which the product is relatively short and of large cross section, resistive barriers around bundles of filaments in an oxide powder doped with conductive materials. In subsequent steps, an electrically insulative powder is used to insulate between a copper tube surrounding the bundles of filaments and an outer resistive ring or to insulate around multifilament strands.

28 Claims, 3 Drawing Figures 4,531,982

SUPERCONDUCTOR MANUFACTURING PROCESS

BACKGROUND OF THE INVENTION

1. Field of the Invention

The present invention concerns a superconductor manufacturing process.

2. Description of the prior art

It is known from French Pat. No. FR-A- 2 165 660 to fabricate superconductors from a multifilament strand of an alloy of niobium and tin, obtained by diffusing tin from a bronze matrix into a strand of niobium filaments at a temperature of approximately 800 degrees C., and to electrically insulate the superconductive strand by means of carbon or magnesium oxide, which have the property of not being soluble in the metals during the heat treatment in question. In the prior art process, as described in the patent on page 4, line 28, the multifilament strand, at its final diameter, is passed into a bath of magnesium hydroxide immediately prior to the diffusion heat treatment. It follows that the superconductive materials are treated when they are of small diameter and very great length.

The disadvantage of this process resides in the fact that it is necessary to apply the insulation over a very great length of wire. This can be accomplished only be spooling the superconductive strand and then paying it out (page 5, line 3), only to subsequently rewind it in order to construct an electromagnet. It should be noted that niobium-tin ($Nb_3Sn$) superconductors are brittle once diffusion has been carried out and that the paying out and rewinding are difficult to execute without causing breaks, as a result of which the superconductors cannot function.

The process in accordance with the present invention remedies this disadvantage. In this process, the electrical insulation is applied before the strand is drawn to final length, which facilitates its manufacture and renders it reliable.

SUMMARY OF THE INVENTION

In one embodiment, the invention includes a superconductor manufacturing process wherein the following steps are carried out in the order indicated:

step 1: bars of a first metal material are placed in a matrix comprising at least a second and a third metal material, said first material and the second material being adapted to form a superconductive intermetallic compound;

step 2: each of said bars and matrix are drawn so as to form a rod having a hexagonal outside contour;

step 3: said hexagonal rods are stacked together and surrounded with a bronze tube;

step 4: the combination is drawn repeatedly so as to reduce its cross section and increase its length to form a multifilament strand;

step 5: the resulting strand is wound onto a spool; and step 6: said spool is heated to approximately 800 degrees C. so that said metal first material diffuses into said second material. The invention is characterized in that steps 2 and 3 may be repeated once or twice (that is, the bronze tubes packed with hexagonal rods are themselves drawn to form multifilament hexagonal rods, and these multifilament hexagonal rods, in turn, are stacked together and surrounded with a further bronze tube. On the last occasion said tube may be of copper instead of bronze. In addition, or alternatively, certain of said multifilament rods may be replaced with copper rods, preferably at the center of the stack, for purposes of stabilization. The invention is further characterized in that at the start of step 3 said hexagonal rods are preferably stacked together while disposing an oxide powder doped with a conductive material between the stacked rods to serve as a resistive barrier. Finally, between steps 3 and 4 there is disposed between said tube and a resistive outer shell an electrically insulative refractory powder which is not soluble in the materials of said tube or said shell.

In an alternative embodiment, the present invention includes a superconductor manufacturing process wherein the following steps are carried out in the order indicated:

step 1: bars of a first metal material are placed in a matrix comprising at least a second and third metal material, said first metal material and the second material being adapted to form a superconductive intermetallic compound;

step 2: each of said bars and matrix are drawn so as to form rods having a hexagonal outside contour;

step 3: said hexagonal rods are stacked together and surrounded with a bronze tube;

step 4: the combination is drawn repeatedly so as to reduce its cross section and increase its length to form a multifilament strand;

step 5: the resulting strand is coated with an insulative sheath, and a plurality of such sheathed strands are placed together to form a multistrand conductor;

step 6: the resulting multistrand conductor is wound onto a spool; and step 7: said spool is heated to approximately 800 degrees C. so that said metal first material diffuses into said second material. This other embodiment is characterized in that steps 2 and 3 may be repeated once or twice; that is the bronze tube packed with hexagonal rods is drawn to form a multifilament hexagonal rod, and similar multifilament rods are stacked together and surrounded by a further bronze tube. On the last occasion said tube may be of copper instead of bronze. In addition, or alternatively, certain of said rods may be replaced with copper rods, preferably at the center of the stack, for purposes of stabilization. Preferably, at the start of step 3 said hexagonal rods are stacked together while disposing an oxide powder doped with a conductive material between the stacked rods to serve as a resistive barrier. In addition to, or instead of, disposing the oxide powder during step 3, during step 5 there is disposed between said multistrand conductors and said resistive sheath an electrically insulative refractory powder which is not soluble in the materials of said resistive sheath or said multistrand conductors.

In accordance with one feature of the invention, the doped oxide and electrically insulative powders may with advantage each be precompacted in a mold (at a pressure of a few dozen $kg/mm^2$, for example).

In accordance with another feature of the invention, the oxide powder is magnesium oxide (MgO) doped with copper or doped with a copper alloy such as bronze or cupro-nickel.

In accordance with still another feature of the invention, the insulative powder is magnesium oxide (MgO) or aluminum oxide ($Al_2O_3$).

Other objects and advantages will appear from the following description of examples of the invention, when considered in connection with the accompanying drawings, and the novel features will be particularly pointed out in the appended claims.

DESCRIPTION OF THE PREFERRED PROCESSES

Figure 1:
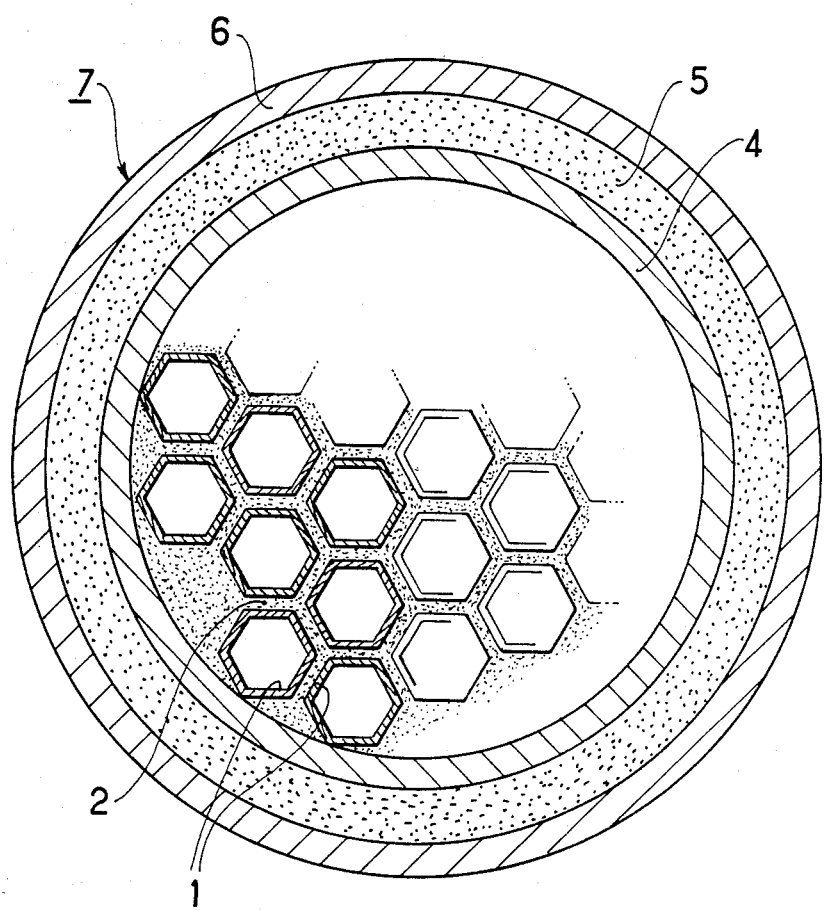
FIG. 1 is a schematic transverse cross section through a multifilament strand at one stage in the manufacture of a superconductor.

Examples of the implementation of the present invention will now be described with reference to FIGS. 1 to 3, by way of illustrative example only. Parts represented in more than one figure retain the same reference numerals in each figure.

FIG. 1 represents a schematic view in transverse cross section and to an enlarged scale, at one stage in its manufacture, of a combination 7 of hexagonal multifilament rods 1 separated by an oxide powder 2 doped with conductive materials, the combination being covered by a copper tube 4 and a resistive ring 6, between which there is disposed an insulative powder 5.

Figure 2:
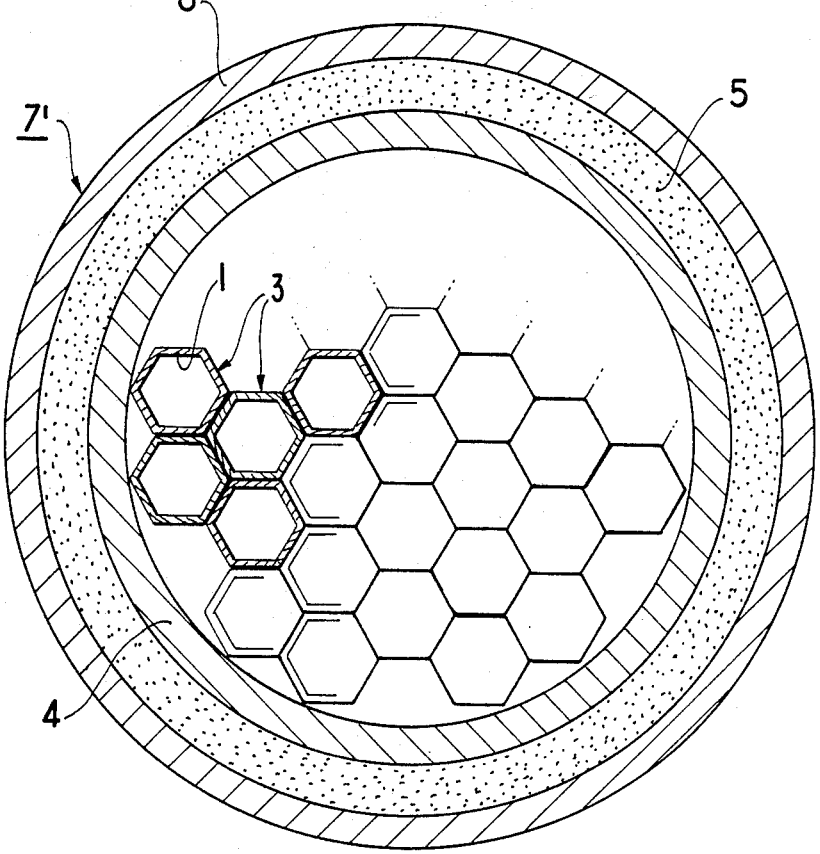
FIG. 2 is a schematic transverse cross section through another form of a multifilament strand at one stage in the manufacture of a superconductor.

FIG. 2 represents a schematic transverse cross section to an enlarged scale, at one stage in its manufacture, of an alternative combination 7' of hexagonal multifilament rods 1 of cupro-nickel with resistive barriers 3, covered with a copper tube 4 and a resistive ring 6, between which there is disposed an insulative powder 5.

Figure 3:
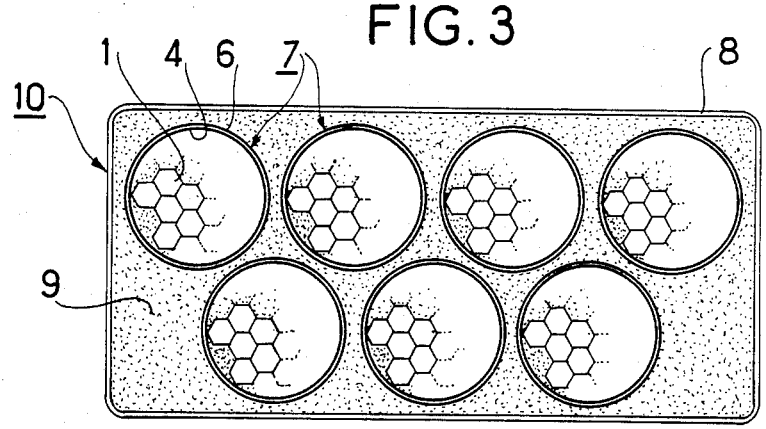
FIG. 3 is a schematic transverse cross section through a multistrand combination at a later stage in the manufacture of a superconductor.

FIG. 3 represents a schematic view to a very enlarged scale, at a later stage in its manufacture, of one end of multistrand conductors 7 surrounded by a resistive sheath 10 containing an insulative powder 9 in the spaces between the conductors and the sheath.

In accordance with the invention, the materials of the bars and the metal matrix are preferably chosen to produce superconductor filaments based on niobium-tin ($Nb_3Sn$). Said filaments may also be based on compounds such as niobium-silicon, niobium-aluminum, vanadium-gallium, vanadium-silicon and compounds based on CHEVREL phases such as lead-molybdenum sulfur ($PbMo_6S_8$). In the case of niobium-tin, the process may start with bars of niobium disposed in a matrix of bronze, based on copper and at least 10% by weight of tin. Note that in the following description, the diffusion of the tin into the niobium is effected at a temperature of approximately 800 degrees C. at the end of all the other manufacturing stages and after winding of multistrand conductors into a spool, because the wires of niobium-tin alloy are brittle once the diffusion has been carried out and are unable to withstand without damage certain manipulations such as spooling of the wires.

In a first manufacturing step niobium bars are placed in a bronze matrix.

In a second manufacturing step the niobium bars and the matrix are drawn so as to obtain hexagonal shaped rods.

In a third step, the hexagonal shaped rods are stacked against one another with, between the hexagons, powder of magnesium oxide (MgO) doped with metal in the form of a conductive alloy such as bronze or cupronickel. The powder may with advantage be precompacted. As previously described, the stacked rods are then surrounded with a bronze tube. This combination is preferably itself drawn to form a hexagonal multifilament rod, such as the multifilament rods 1 in FIG. 1. There are thus obtained resistive barriers which have the electrical characteristic of being neither excessively conductive nor excessively resistive, in order to eliminate spurious induced currents which appear in the copper between the superconductive filaments and which are dissipated in the form of heat.

At the end of the third step, which is valid for FIGS. 1 and 2, the bundle of multifilament rods 1 is covered with a copper tube 4 which serves to stabilize the superconductor; that is to say, it provides for carrying the current in the event that the superconductor is accidentally returned to the normal state, to prevent the superconductor burning by virtue of its high resistence. An electrically insulative powder 5 is then placed between the copper tube 4 and a resistive ring 6 of cupro-nickel or stainless steel. The insulative powder 5 can also serve at a later stage to electrically insulate the strands 7 or 7' of FIG. from one another when they are wound in a final step, thereby avoiding the risk of their coming into contact with one another and so creating short-circuits.

The insulative powder 5 shown in FIGS. 1 and 2 is preferably magnesium oxide (MgO). It may also be aluminum oxide ($Al_2O_3$), or powdered glass which is stable at 800 degrees C., or powdered quartz which is also stable at 800 degrees C.

During a fourth step, the conductor shown in FIGS. 1 and 2 is repeatedly drawn (30 times for example) until the cross section of the conductor is reduced one hundredfold, from a diameter of 50 millimeters to a diameter of 0.5 millimeters, the thickness of the oxide layer 5 thus decreasing from one millimeter to 10 microns.

During a fifth step, the conductor which has been lengthened and reduced in cross section in this way is wound so as to form an electromagnet coil, for example.

During a sixth step, heat treatment at 800 degrees C. is carried out so as to bring about in situ diffusion of the metal materials in the coil.

FIG. 3 shows a product which is more complex than that of FIGS. 1 and 2 since the strands 7 or 7' obtained in the manner previously described by the first, second, third and fourth steps are placed, during a new fifth step, inside a resistive sheath 8 containing an insulative powder 9 identical to the previously defined powder 5. There are seven strands 7 or 7', for example. The resistive sheath may be fabricated from cupro-nickel or stainless steel.

The insulative powder may with advantage be precompacted in a mold (at a pressure of a few tens of kilograms per $mm^2$, for example).

The combination constitutes a multistrand conductor 10. During a new sixth step, the multistrand conductor 10 is drawn at least once in a manner similar to that of the fourth step previously described.

During a new seventh step the drawn multistrand conductor 10 is wound into an electromagnet coil, for example.

During an eighth step, heat treatment at 800 degrees C. is carried out in order to bring about diffusion of the metal materials to form the superconductive phase.

It will be understood that various changes in the details, materials and arrangements of parts, which have been herein described and illustrated in order to explain the nature of the invention, may be made by those skilled in the art within the principle and scope of the invention as expressed in the appended claim.

In particular, superconductor filaments based on niobium-tin may also be produced from bronze bars placed in a niobium-tin ($Nb_3Sn$) matrix. The matrix for producing superconductor filaments alternatively can be composed of niobium-silicon ($Nb_3Al$), vanadium-gallium ($V_3Ga$), vanadium-silicon ($V_3Si$), lead-molybdenum-sulfur ($PbMo_6S_8$), or a CHEVREL phase-based superconductor.

There is claimed:

1. A process for manufacturing a superconductor, the process having the following sequential steps:
    (a) placing a bar of a first metal in a matrix of at least a second and a third metal material, said second metal material being capable of combining, when heated, with the first metal to form a superconductor;
    (b) working the bar and matrix together to form a rod having a hexagonal cross section;
    (c) packing a plurality of said rods into a bronze tube;
    (d) repeatedly drawing the assembly of the preceding step to form a multifilament strand having a reduced cross section and increased length;
    (e) arranging the multifilament strand into a desired configuration;
    (f) heating the strand in the desired configuration to a temperature at which the first metal combines with the second metal material to form a superconductor, wherein the improvement comprises:
    between steps (c) and (d) surrounding said bronze tube with a resistive tube and
    disposing between the bronze tube and the resistive tube an electrically insulating refractory powder that is not soluble in the material of either tube.

2. A process according to claim 1 further comprising the step of precompacting the insulating refractory powder.

3. A process according to claim 1, wherein the insulating refractory powder is aluminum oxide ($Al_2O_3$).

4. A process according to claim 1, wherein the insulating refractory powder is magnesium oxide (MgO).

5. A process according to claim 1, wherein the insulating refractory powder is a glass stable at 800 degrees C.

6. A process according to claim 1, wherein the insulating refractory powder is a quartz stable at 800 degrees C.

7. A process according to claim 1, further comprising:
    between steps (c) and (d), working the bronze tube packed with the plurality of said rods to form a multifilament rod having a hexagonal cross section and
    packing a plurality of said multifilament hexagonal rods into an additional tube, said steps of working the bronze tube packed with rods into a hexagonal multifilament rod and packing a plurality of said multifilament rods into an additional tube being performed at least once, and the final one of said additional tubes being composed of copper.

8. A process according to claim 7, the process further comprising:
    prior to step (d), surrounding said final additional tube composed of copper with a resistive tube and
    disposing between the copper tube and the resistive tube an electrically insulating refractory powder that is not soluble in the material of either tube.

9. A process according to claim 8, the process further comprising the step of precompacting said electrically insulating refractory powder.

10. A process according to claim 1, further comprising:
    forming at least one hexagonal rod composed of copper and
    substituting at least one of said hexagonal copper rods for a corresponding at least one of said plurality of rods.

11. A process according to claim 1, further comprising:
    step (c) includes disposing a resistive barrier material between the packed rods to reduce spurious induced currents in the finished superconductor.

12. A process according to claim 11, wherein the resistive barrier material comprises:
    an oxide powder doped with a conductive substance.

13. A process according to claim 12 further comprising the step of
    precompacting the doped oxide powder.

14. A process according to claim 12, wherein the resistive barrier material comprises:
    magnesium oxide (MgO) doped with a copper alloy.

15. A process according to claim 11, wherein the matrix is an intermetallic compound in the form of niobium-tin ($Nb_3Sn$), the first metal is bronze, and the second metal material is niobium.

16. A process according to claim 11, wherein the matrix is an intermetallic compound selected from the group consisting of niobium-silicon ($Nb_3Si$); niobium-aluminum ($Nb_3Al$); vanadium-gallium ($V_3Ga$); and vanadium-silicon ($V_3Si$).

17. A process according to claim 11, wherein the matrix is an intermetallic compound in the form of a CHEVREL phase-based superconductor.

18. A process according to claim 10, wherein the matrix is an intermetallic compound in the form of lead-molybdenum-sulfur ($PbMo_6S_8$).

19. A process for manufacturing a superconductor, the process having the following sequential steps:
    (a) placing a bar of a first metal in a matrix of at least a second and a third metal material, said second metal material being capable of combining, when heated, with the first metal to form a superconductor;
    (b) working the bar and matrix together to form a rod having a hexagonal cross section;
    (c) packing a plurality of said rods into a bronze tube;
    (d) repeatedly drawing the assembly of the preceding step to form a multifilament strand having a reduced cross section and increased length;
    (e) coating the multifilament strand with an insulative sheath;
    (f) placing a plurality of said sheathed strands together to form a multistrand conductor;
    (g) arranging the multifilament conductor into a desired configuration;
    (h) heating the conductor in the desired configuration to a temperature at which the first metal combines with the one element to form a superconductor, wherein the improvement comprises:

between steps (c) and (d) surrounding said bronze tube with a resistive tube and disposing between the bronze tube and the resistive tube an electrically insulating refractory powder that is not soluble in the material of either tube.

20. A process according to claim 19, further comprising:

between steps (c) and (d), working the bronze tube packed with the plurality of said rods to form a multifilament rod having a hexagonal cross section, and packing a plurality of said multifilament hexagonal rods into an additional tube, said steps of working the bronze tube packed with rods into a hexagonal multifilament rod and packing a plurality of said multifilament rods into an additional tube being performed at least once, and the final one of said additional tubes being composed of copper.

21. A process according to claim 19, further comprising:

forming at least one hexagonal rod composed of copper and substituting at least one of said hexagonal copper rods for a corresponding at least one of said plurality of rods in step (c).

22. A process according to claim 19, further comprising:

step (c) includes disposing a resistive barrier material between the packed rods to reduce spurious induced currents in the finished superconductor.

23. A process for manufacturing a superconductor, the process having the following sequential steps:

(a) placing a bar of a first metal in a matrix of at least a second and a third metal material, said second metal marterial being capable of combining, when heated, with the first metal to form a superconductor;

(b) working the bar and matrix together to form a rod having a hexagonal cross section;

(c) packing a plurality of said rods into a bronze tube;

(d) repeatedly drawing the assembly of the preceding step to form a multifilament strand having a reduced cross section and increased length;

(e) arranging the multifilament strand into a desired configuration;

(f) heating the strand in the desired configuration to a temperature at which the first metal combines with the second metal material to form a superconductor, wherein the improvement comprises:

step (c) includes disposing a resistive barrier material between the packed rods to reduce spurious induced currents in the finished superconductor, the resistive barrier material comprising an oxide powder doped with a conductive substance.

24. A process according to claim 23 further comprising the step of precompacting the doped oxide powder.

25. A process according to claim 23, wherein the resistive barrier material comprises:

magnesium oxide (MgO) doped with a copper alloy.

26. A process for manufacturing a superconductor, the process having the following sequential steps:

(a) placing a bar of a first metal in a matrix of at least a second and a third metal material, said second metal material being capable of combining, when heated, with the first metal to form a superconductor;

(b) working the bar and matrix together to form a rod having a hexagonal cross section;

(c) packing a plurality of said rods into a bronze tube;

(d) repeatedly drawing the assembly of the preceding step to form a multifilament strand having a reduced cross section and increased length;

(e) coating the multifilament strand with an insulative sheath;

(f) placing a plurality of said sheathed strands together to form a multistrand conductor;

(g) arranging the multifilament conductor into a desired configuration;

(h) heating the conductor in the desired configuration to a temperature at which the first metal combines with the one element to form a superconductor, wherein the improvement comprises:

step (c) includes disposing a resistive barrier material between the packed rods to reduce spurious induced currents in the finished superconductor, the resistive barrier material comprising an oxide powder doped with a conductive substance.

27. A process according to claim 26 further comprising the step of precompacting the doped oxide powder.

28. A process according to claim 26, wherein the resistive barrier material comprises: magnesium oxide (MgO) doped with a copper alloy.

* * * * *